United States Patent
Chen

(10) Patent No.: US 7,161,443 B2
(45) Date of Patent: Jan. 9, 2007

(54) TEMPERATURE COMPENSATED CRYSTAL OSCILLATOR

(75) Inventor: Chun-Ying Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 55 days.

(21) Appl. No.: 10/952,932

(22) Filed: Sep. 30, 2004

(65) Prior Publication Data

US 2006/0071728 A1   Apr. 6, 2006

(51) Int. Cl.
*H03B 5/32* (2006.01)
(52) U.S. Cl. .................... 331/176; 331/158
(58) Field of Classification Search .......... 331/176, 331/157, 158, 116 R, 73
See application file for complete search history.

(56) References Cited

U.S. PATENT DOCUMENTS 4,424,486 A   1/1984 Denton et al.
(Continued)

FOREIGN PATENT DOCUMENTS

EP   0 909 035 A2   4/1999
(Continued)

OTHER PUBLICATIONS

Habic, Dejan et al., "The Design of a Microcontroller Temperature Compensated Crystal Oscillator (μCTCXO) and Automatic Compensation Line," IEEE Transactions on Ultrasonics, Ferroelectrics, and Frequency Control, vol. 42, No. 4, Jul. 1995.

(Continued)

*Primary Examiner*—Joseph Chang
(74) *Attorney, Agent, or Firm*—Sterne, Kessler, Goldstein & Fox, P.L.L.C.

(57) ABSTRACT

An environmental-compensated oscillator includes a reference clock waveform generator; a phase locked loop receiving the reference clock waveform and outputting a phase locked clock waveform; and a sensor outputting a voltage corresponding to an environmental parameter of the generator. The voltage is used by the PLL to compensate the phase locked clock waveform. The PLL includes a phase detector, a charge pump coupled to an output of the phase detector, a low pass filter coupled to an output of the charge pump, a voltage controlled oscillator ("VCO") coupled to an output of the low pass filter, and a feedback path coupled between an output of the VCO and the phase detector, wherein the feedback path includes a phase rotator capable of fine tuning an output frequency of the VCO responsive to a frequency of an input clock. An accumulator is coupled to the phase rotator and supplies the input clock to the phase rotator. The phase rotator finely tunes the VCO output frequency. An analog-to-digital converter converts the voltage to a digital representation. The digital representation is mapped to a frequency adjustment for use by the PLL for the compensation. The environmental parameter is any of temperature, stress and power supply voltage.

18 Claims, 1 Drawing Sheet

U.S. PATENT DOCUMENTS

| | | |
|---|---|---|
| 4,816,775 A | 3/1989 | Ryan |
| 5,485,490 A | 1/1996 | Leung et al. |
| 5,570,066 A | 10/1996 | Eberhardt et al. |
| 6,002,279 A | 12/1999 | Evans et al. |
| 6,122,336 A | 9/2000 | Anderson |
| 6,310,498 B1 | 10/2001 | Larsson |
| 6,319,498 B1 | 11/2001 | Findeis et al. |
| 6,363,124 B1 | 3/2002 | Cochran |
| 6,397,042 B1 | 5/2002 | Prentice et al. |
| 6,473,470 B1 | 10/2002 | Matui |
| 6,509,773 B1 | 1/2003 | Buchwald et al. |
| 6,570,946 B1 | 5/2003 | Homol et al. |
| 6,901,126 B1 | 5/2005 | Gu |
| 6,922,109 B1 | 7/2005 | Fallahi et al. |
| 2001/0006544 A1 | 7/2001 | Kawasaki et al. |
| 2001/0048330 A1* | 12/2001 | Oda .......................... 327/157 |
| 2002/0005765 A1* | 1/2002 | Ashley et al. ............. 331/176 |
| 2002/0021153 A1 | 2/2002 | Saeki |
| 2003/0185327 A1 | 10/2003 | Chen |

FOREIGN PATENT DOCUMENTS

| | | |
|---|---|---|
| WO | WO 00/46949 | 8/2000 |
| WO | WO 01/84702 A2 | 11/2001 |

OTHER PUBLICATIONS

Patrik Larsson "A 2-1600-MHz CMOS Clock Recovery PLL with Low-V$_{dd}$ Capability" IEEE Journal of Solid-State Circuits, vol. 34, No. 12, Dec. 1999, pp. 1951-1960.

* cited by examiner

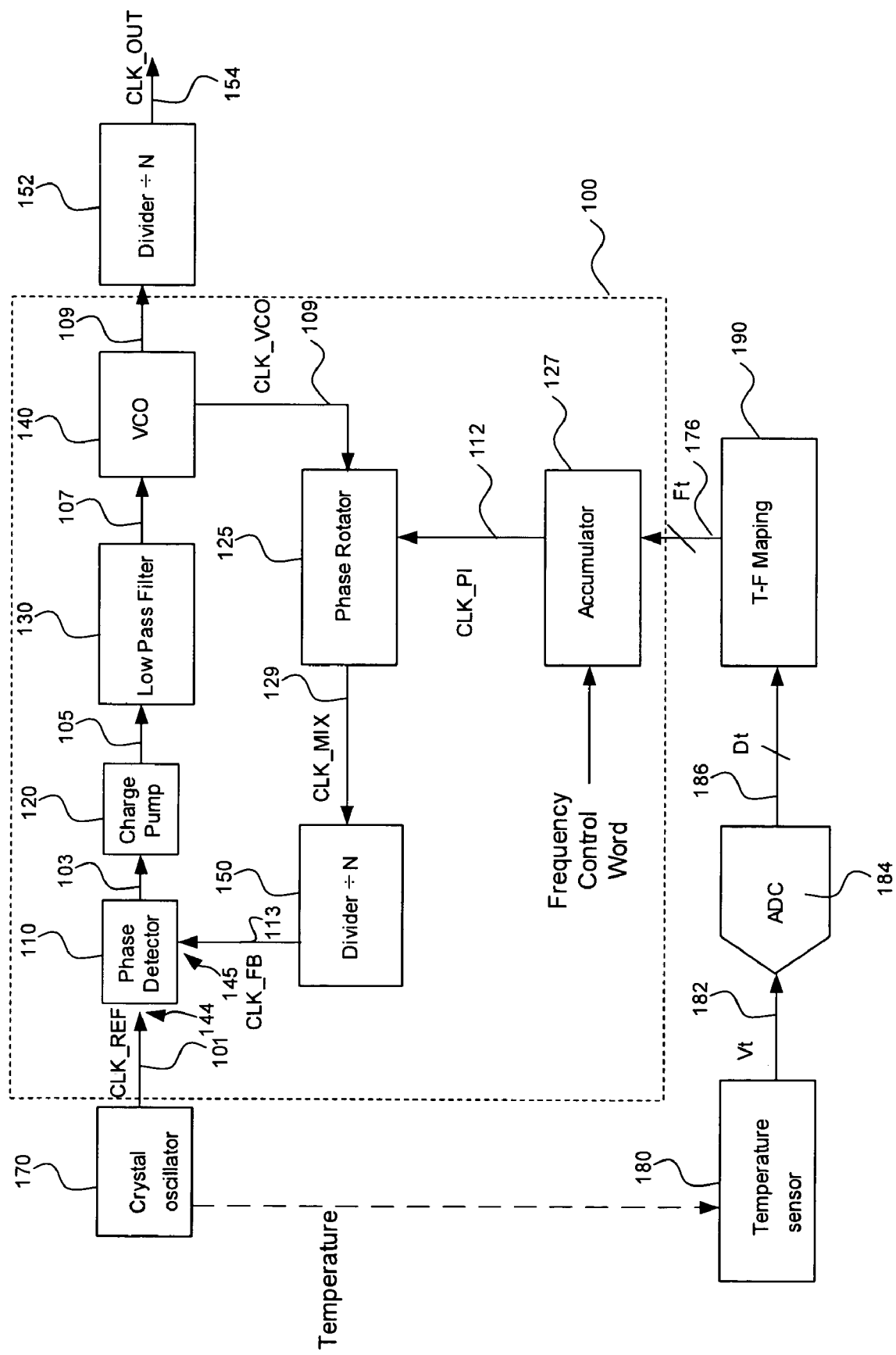

TEMPERATURE COMPENSATED CRYSTAL OSCILLATOR

CROSS REFERENCE TO RELATED APPLICATIONS

This application is related to and incorporates by reference U.S. patent application Ser. No. 10/284,341, filed Oct. 31, 2002, entitled PHASE-INTERPOLATOR BASED PLL FREQUENCY SYNTHESIZER.

BACKGROUND OF THE INVENTION

1. Field of the Invention

The present invention is related to crystal oscillators, and more particularly, to digitally controlled temperature compensated oscillators.

2. Background Art

Many commercial oscillators are based on LC type oscillators. The "C" in the LC oscillator, or the capacitance, is usually implemented as a varactor, which is essentially a reverse-biased diode. The capacitance of the varactor is voltage controlled, by controlling the reverse biasing of the diode.

The voltage for controlling the varactor is usually generated by a temperature controlled sensor. The "L" (inductance) is usually due to the size of the crystal itself, although sometimes a separate inductive element is used. In other words, the LC oscillator is compensated by the temperature.

However, one difficulty with commercially available LC oscillators is that it is difficult to match the temperature dependence of the inductance (L) to that of the C. Typically, the temperature dependencies of the L and C are of an opposite sign, and the circuit designer tries to match the two dependencies such that the overall response of the LC oscillator is flat over some specified temperature range.

In practice however, such a precise matching is very difficult. The presence of the mismatch in the temperature dependence of the L and the C results in a temperature dependence of the frequency of the output, which in turn results in distortions and nonlinearities in circuits that rely on a precise clock waveform. Accordingly, a need exists for an oscillator whose frequency response is flat over the specified temperature range.

BRIEF SUMMARY OF THE INVENTION

The present invention is related to a temperature compensated crystal oscillator that substantially obviates one or more of the disadvantages of the related art.

In one embodiment of the invention, there is provided an environmental-compensated oscillator that includes a reference clock waveform generator; a phase locked loop receiving the reference clock waveform and outputting a phase locked clock waveform; and a sensor outputting a voltage corresponding to an environmental parameter of the generator. The voltage is used by the PLL to compensate the phase locked clock waveform. The PLL includes a phase detector, a charge pump coupled to an output of the phase detector, a low pass filter coupled to an output of the charge pump, a voltage controlled oscillator ("VCO") coupled to an output of the low pass filter, and a feedback path coupled between an output of the VCO and the phase detector, wherein the feedback path includes a phase rotator capable of fine tuning an output frequency of the VCO responsive to a frequency of an input clock. The feedback path includes an accumulator coupled to the phase rotator. The accumulator supplies the input clock to the phase rotator. The phase rotator finely tunes the VCO output frequency upon application of the input clock. The phase rotator includes means for weighting the plurality of VCO output phases over time responsive to the input clock, and means for combining the weighted VCO output phases to produce an output phase of the phase rotator, the output phase rotating responsive to a frequency of the input clock. An analog-to-digital converter converts the voltage to a digital representation. The digital representation is mapped to a frequency adjustment for use by the PLL for the compensation. The environmental parameter is any of temperature, stress and power supply voltage.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings:

FIG. 1 illustrates an exemplary embodiment of a temperature-compensated oscillator of the present invention.

DETAILED DESCRIPTION OF THE INVENTION

Reference will now be made in detail to the embodiments of the present invention, examples of which are illustrated in the accompanying drawings.

The present invention utilizes a phase locked loop (PLL) with temperature sensing to temperature-stabilize a crystal oscillator. The PLL in the present invention includes a phase detector, a charge pump, a low pass filter, a voltage controlled oscillator ("VCO") and a divider circuit. It also includes a phase rotator placed in the feedback path of the PLL. The phase rotator connects the VCO output to the divider circuit.

The PLL implements a coarse output frequency control and a fine output frequency control. In one embodiment, the PLL implements coarse frequency control by adjusting a divider ratio of the divider circuit. Alternatively, the PLL implements coarse frequency control by varying input reference signal frequency, received by the phase detector.

The PLL implements fine output frequency control by using the phase rotator in the feedback path of the PLL. The phase rotator adjusts the VCO output frequency by constantly rotating phases of the VCO output signal. The speed of rotation of the phase rotator determines whether VCO frequency is adjusted up or down. An accumulator circuit, controlled by a frequency control word (a programmable step), controls the speed of rotation of the phase rotator.

The PLL receives a reference signal and generates a plurality of output signals having a plurality of respective phases. The output signals are supplied to the phase rotator in the feedback path of the PLL of the frequency synthesizer.

The phase rotator continuously generates more phases from the plurality of received phases. The generated phases are adjacent to one another and are continuously supplied to the output of the phase rotator. The generated phases are rotated at a continuous rate to implement fine frequency tuning, since frequency is a derivative of phase.

FIG. 1 illustrates how a phase lock loop ("PLL") 100 is used in an exemplary embodiment of the invention. Phase lock loop 100 has a phase detector 110, a charge pump 120, a low pass filter 130, a voltage controlled oscillator ("VCO") 140, a phase rotator 125 and a divider 150.

Phase detector 110 is a device that compares the phases of two input signals, generating a phase-error output that is a measure of their difference. More specifically, phase detector 110 receives an input reference signal CLK_REF 101 from a crystal oscillator 170 at a first input terminal 144 and a VCO feedback signal 113 at a second input terminal 145. Phase detector 110 compares the phases of the input reference signal CLK_REF 101 with the VCO feedback signal 113.

Charge pump 120 is coupled to phase detector 110. Charge pump 120 generates an output current 105 representative of the phase difference between input reference signal CLK_REF 101 and VCO feedback signal 113 (CLK_FB). Low pass filter 130 low-pass filters phase detector output current 105 to remove high frequency noise, and generates an output voltage 107.

Output voltage 107 of low pass filter 130 is the control voltage for VCO 140. VCO 140 receives control voltage 107 and generates a CLK_VCO signal 109 having a frequency that is determined by control voltage 107. Divider circuit 150 divides the frequencies of VCO output CLK_VCO signal 109 so that it is consistent with the frequency of the input signal CLK_REF 101, generating the VCO feedback signal 113.

The output signal CLK_VCO 109 is also the output of the PLL 100, or, optionally, is frequency—divided by the frequency divider 152.

The feedback path also receives the CLK_VCO signal 109 as an input to generate the feedback signal CLK_FB signal 113 for processing by the phase detector 110. More specifically, the CLK_VCO signal 109 is the input signal for the phase rotator 125. In an alternative embodiment, CLK_VCO signal 109 can be substituted with an external clock, which is independent of CLK_VCO signal 109. The phase rotator 125 continuously rotates the phase of the CLK_VCO signal 109 at a rotation speed that is determined by the accumulator 127, resulting in a CLK_MIX signal 129. The continuous phase rotation by the phase rotator 125 implements fine frequency tuning, since frequency is the derivative of phase. The phase rotator 125 outputs the CLK_MIX signal 129 to the frequency divider 150. Divider 150 frequency divides the CLK_MIX signal 129 to generate CLK_FB signal 112 that has a frequency consistent with the frequency of the CLK_REF 101. Phase detector 110 receives CLK_FB signal 112 for comparison with the CLK_REF signal 101.

For the PLL 100 to lock to the reference frequency of CLK_REF 101, the following relationship should hold:

$$f_{CLK\_FB} = f_{CLK\_REF}$$

Therefore, the frequency of CLK_MIX signal 129 should accord to the following relationship:

$$f_{CLK\_MIX} = N \cdot f_{CLK\_REF}$$

(where N is the same N as used in the frequency divider.) Accumulator 127 controls rotation speed of phase rotator 125 based on the frequency of the CLK_VCO 109 and a frequency control word. The frequency control word is a digital signal having bits that represent the desired frequency of the CLK_VCO 109, or a desired increase or decrease in the rotation speed of the phase rotator 125. When accumulator 127 reaches a certain threshold value, it generates a CLK_PI signal 112. CLK_PI signal 112 triggers the phase rotator 125 to either increase or decrease a phase step at which phase rotator 125 is rotating. Speed of rotation of phase rotator 125 is dependent on CLK_PI signal 112. For example, if CLK_PI signal 112 is 1 MHz, then speed of rotation is also 1 MHz. Therefore, CLK_PI signal 112 triggers the phase rotator 125 to perform fine frequency tuning of the CLK_MIX 210 and the CLK_VCO 109.

The phase rotator 125 continuously shifts the phase of CLK_VCO 109 to generate the CLK_MIX signal 129. The continuous phase rotation of the CLK_MIX signal 129 causes a fine frequency shift in the CLK_MIX signal 129 (and therefore CLK_FB signal 113) relative to CLK_VCO 109. The fine frequency shift is ultimately reflected in the frequency of the CLK_VCO signal 109 by the feedback properties of the PLL 100. Accordingly, an increase or decrease in the rotation speed of the phase rotator 125 adjusts the frequency shift of the CLK_MIX signal 129, causing a corresponding frequency shift in the CLK_VCO signal 109, since frequency is the derivative of its phase. The frequency shift observed in the CLK_VCO signal 109 may be a fraction of that observed relative to CLK_MIX signal 129 because of the frequency divider 150.

As discussed above, fine frequency tuning of the CLK_VCO signal 109 is implemented by using the phase rotator 125, whereas, coarse frequency tuning is implemented using the divider 150. More specifically, coarse frequency tuning can be performed by adjusting the divider ratio of the divider 150. Alternatively, the frequency of the CLK_REF 101 can be adjusted to perform coarse frequency tuning.

The PLL 100 shown in FIG. 1 is used as a basis for a temperature compensated oscillator. The input to the PLL 100 is a clock reference signal CLK_REF 101 from a crystal oscillator 170. A temperature sensor 180 outputs a signal 182 that represents the temperature, to an analog to digital converter 184. The temperature can correspond to the temperature of the crystal oscillator 170. The output of the analog to digital converter 184 is a signal 186, which is received by block 190. The block 190 performs temperature-to-frequency mapping, for example, using a bitmap, or read-only memory, or any other mechanism known in the art for converting a signal that corresponds to the temperature to a frequency correction signal 176. The frequency correction signal 176 can be used to offset any frequency drift of the CLK_OUT signal 154 that is caused by temperature change of the crystal oscillator 170. The signal 176, which represents the frequency correction, is inputted to the accumulator 127. The CLK_OUT signal 154, which is the desired clock waveform, is outputted.

In addition to (or instead of) the temperature sensor 180, other parameters that affect the stability of the clock waveform can also be detected and used for control. Examples include such parameters as stress, humidity, supply voltage, etc.

As discussed above, the phase rotator 125 (also called a "phase interpolator") generates more phases out of the phases received from the VCO 140, and the phases are continuously rotated (in time) to implemented a frequency shift in the signal CLK_MIX signal 129. The phases are rotated in an incremental manner, where the difference between two phase states is referred to as jitter, and generally should be reduced.

A rotator consists of a plurality of digital-to-analog converters (DACs) coupled together into a group according to clock phase sources of 0°, 90°, 180°, and 270°. The phase rotator operates in a full phase cycle of 360°. As would be understood by one having ordinary skill in the art, other clock phase sources are possible.

The negative feedback loop in FIG. 1 is similar to a conventional PLL but with additional phase-rotator between the VCO 140 and the divider 150.

The loop forces the feedback clock 113 (CLK_FB) to phase- and frequency lock to external reference clock 101 (CLK_REF). Thus, when the loop is stable:

$$f_{CLK\_FB} = f_{CLK\_REF}$$

Therefore the frequency of CLK_MIX is:

$$f_{CLK\_MIX} = N \cdot f_{CLK\_REF}$$

The function of the phase rotator 125 is to rotate a phase step with a rate of CLK_PI 112. Thus, the phase relation between CLK_MIX 129 and CLK_VCO signal 109 is:

$$\phi_{CLK\_MIX}(t) = \phi_{CLK\_VCO}(t) + \sum_{k=0}^{M} \phi_{step} \delta(t - k/f_{PI})$$

where M is equal to the maximum integer of $t \cdot f_{PI}$. Assuming $L = 2\pi/\phi_{step}$, the above equation can be rewritten to:

$$2\pi f_{VCO} t = 2\pi f_{CLK\_MIX} t \pm \frac{2\pi f_{PI} t}{L} + \frac{2\pi}{L}(1 - \delta(t - M/f_{PI}))$$

The plus or minus sign depends on the sign of phase step. The last term is a phase error term. The VCO 140 frequency is shifted by frequency of $f_{PI}/L$. Thus the VCO 140 frequency can be tuned by controlling $f_{PI}$. The last phase term in time domain corresponding to a jitter with a random value less than $1/(f_{VCO} \cdot L)$ at a fundamental frequency of $f_{PI}$. If $f_{PI}$ is outside the PLL 100 loop bandwidth, the jitter will be attenuated by the PLL 100. Thus the VCO 140 output signal 109 is a clean signal again. The phase-rotator based PLL can which use a digital control directly, and the frequency can be precisely tuned through digital control. Also, process variation is reduced.

The VCO 140 noise contributed by CLK_PI 112 is attenuated by a factor of L, thus the programmable clock source of CLK_PI 112 can tolerate more noise. It can be generated from a simple accumulator consisting of a counter and an adder. The average frequency of CLK_PI 112 is:

$$f_{CLK\_PI} = f_{VCO} \cdot \frac{FCW}{P}$$

where P is the size of accumulator. FCW is the frequency control word. The clock input of accumulator can be from any clock source depending on the tuning range and tuning resolution.

Conclusion

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A temperature-compensated oscillator comprising:
   a crystal oscillator configured to output a reference clock;
   a phase locked loop (PLL) configured to receive the reference clock, wherein the PLL includes a feedback path having a phase rotator; and
   a temperature sensor configured to output a voltage corresponding to a temperature of the crystal oscillator,
   wherein the phase rotator is configured to fine tune an output frequency of the PLL based on the sensed temperature.

2. The temperature-compensated oscillator of claim 1, wherein the PLL further comprises:
   a phase detector;
   a charge pump coupled to an output of the phase detector;
   a low pass filter coupled to an output of the charge pump; and
   a voltage controlled oscillator ("VCO") coupled to an output of the low pass filter;
   wherein the feedback path is coupled between an output of the VCO and the phase detector.

3. The temperature-compensated oscillator of claim 2, wherein the feedback path further comprises an accumulator coupled to the phase rotator, wherein the accumulator is configured to receive the voltage and to supply an input clock based on the received voltage to the phase rotator.

4. The temperature-compensated oscillator of claim 3, wherein the phase rotator is configured to adjust a rotation speed based on the received input clock.

5. The temperature-compensated oscillator of claim 1, further comprising an analog-to-digital converter coupled to the temperature sensor for converting the voltage to a digital representation.

6. The temperature-compensated oscillator of claim 5, further comprising a module configured to map the digital representation to a frequency adjustment for use by the phase rotator for temperature compensation.

7. A method of temperature-stabilizing an oscillator comprising:
   receiving an input reference signal having a reference phase and frequency;
   generating a voltage controlled oscillator (VCO) output signal based on the input reference signal;
   feeding the VCO output signal through the feedback path to the phase detector;
   receiving a temperature input in the feedback path; and
   phase rotating the VCO output signal in the feedback path based on the temperature to perform fine frequency tuning the VCO output signal.

8. The method of claim 7, further comprising the step of adjusting a divider ratio of a frequency divider in the feedback path to perform coarse frequency tuning.

9. The method of claim 7, further comprising the step of adjusting the reference signal frequency to perform coarse frequency tuning.

10. The method of claim 7, further comprising converting the temperature input to a digital representation.

11. The method of claim 10, further comprising mapping the digital representation to a frequency adjustment for use by the feedback path for temperature compensation.

12. A environmental-compensated oscillator comprising:
a reference clock waveform generator;
a phase locked loop (PLL) configured to receive a reference clock waveform, wherein the PLL includes a feedback path having a phase rotator; and
a sensor configured to output a voltage corresponding to an environmental parameter of the generator,
wherein the phase rotator is configured to fine tune an output frequency of the PLL based on the sensed temperature.

13. The oscillator of claim 12, wherein the PLL comprises:
a phase detector;
a charge pump coupled to an output of the phase detector;
a low pass filter coupled to an output of the charge pump; and
a voltage controlled oscillator ("VCO") coupled to an output of the low pass filter;
wherein the feedback path is coupled between an output of the VCO and the phase detector.

14. The oscillator of claim 13, wherein the feedback path further comprises an accumulator coupled to the phase rotator, wherein the accumulator is configured to receive the voltage and to supply an input clock based on the received voltage to the phase rotator.

15. The oscillator of claim 14, wherein the phase rotator is configured to adjust a rotation speed based on the received input clock.

16. The oscillator of claim 12, further comprising an analog-to-digital converter coupled to the sensor for converting the voltage to a digital representation.

17. The oscillator of claim 16, further comprising a module configured to map the digital representation to a frequency adjustment for use by the phase rotator for compensation.

18. The oscillator of claim 12, wherein the environmental parameter is any of temperature, stress and power supply voltage.

* * * * *